(12) United States Patent
Okuwaki et al.

(10) Patent No.: US 7,345,318 B2
(45) Date of Patent: Mar. 18, 2008

(54) LIGHT-EMITTING DIODE

(75) Inventors: Daisaku Okuwaki, Fujiyoshida (JP); Takashi Shimura, Fujiyoshida (JP)

(73) Assignee: Citizen Electronics Co., Ltd., Yamanashi (JP)

( * ) Notice: Subject to any disclaimer, the term of this patent is extended or adjusted under 35 U.S.C. 154(b) by 32 days.

(21) Appl. No.: 11/173,149

(22) Filed: Jul. 5, 2005

(65) Prior Publication Data

US 2006/0001030 A1    Jan. 5, 2006

(30) Foreign Application Priority Data

Jul. 5, 2004    (JP)    ............................ P2004-197480

(51) Int. Cl.
  *H01L 27/15* (2006.01)
(52) U.S. Cl. ................. 257/98; 257/103; 257/E51.018; 257/E33.001
(58) Field of Classification Search ................... 257/79, 257/89, 98, 99, 100, 103, E51.018, E33.001, 257/E33.077, E33.054
See application file for complete search history.

(56) References Cited

U.S. PATENT DOCUMENTS

| | | | |
|---|---|---|---|
| 6,747,293 B2 * | 6/2004 | Nitta et al. | 257/99 |
| 6,869,813 B2 * | 3/2005 | Okazaki | 438/22 |
| 2005/0213334 A1 * | 9/2005 | Lee et al. | 362/310 |
| 2005/0219835 A1 | 10/2005 | Nagayama et al. | |

FOREIGN PATENT DOCUMENTS

| | | |
|---|---|---|
| JP | 2001-345482 A | 12/2001 |
| JP | 2002-94128 A | 3/2002 |
| JP | 2002-226846 A | 8/2002 |
| JP | 2005277227 A | 10/2005 |

* cited by examiner

*Primary Examiner*—Howard Weiss
*Assistant Examiner*—(Vikki) Hoa B. Trinh
(74) *Attorney, Agent, or Firm*—Browdy and Neimark, PLLC

(57) ABSTRACT

An LED comprising a circuit board, a connecting electrode unit provided on the circuit board, a reflective cup provided within the circuit board, an LED element disposed in the reflective cup and connected to the connecting electrode unit, and a resin with which the reflective cup is filled, a fluorescent material contained in the resin absorbing one portion of light emitted from the LED element and changing the wavelength of the light.

12 Claims, 6 Drawing Sheets

LIGHT-EMITTING DIODE

CROSS-REFERENCE TO THE RELATED APPLICATION

This application claims the priority benefit of Japanese Patent Application No. 2004-197480 filed on Jul. 5, 2004, which is incorporated herein by reference in its entirety.

BACKGROUND OF THE INVENTION

1. Field of the Invention

The present invention relates to an improvement in a light-emitting diode (LED), more specifically to an LED having high emission efficiency and an effective focusing property.

2. Description of Related Art

Conventionally known is a packaged LED including a blue LED element emitting blue light and a resin for sealing the blue LED element and containing therein a YAG fluorescent material which is excited by the emitted blue light and emits yellow light (for reference, see JP 2001-345482 A, FIGS. 1, 2 and 3, pages 3 and 4, and JP2002-94128 A, FIG. 1, page 3). In the LED, the blue light emitted from the blue LED element and the yellow light from the fluorescent material are mixed in the eye of the viewer to appear to the viewer as white light.

Also known is an LED lamp, including an LED element emitting near-ultraviolet light and an RGB fluorescent material, which is capable of emitting with a strong emission intensity almost the same white light as the white light for general lighting, having balanced color components of the primary colors red, green and blue through excitement of the RGB fluorescent material by the near-ultraviolet light from the LED element (for reference, see JP 2002-226846 A, FIG. 1, paragraphs 0016 to 0022).

Generally, in a surface-mounted LED, the LED element and wiring circuit are wire-bonded or flip-chip-connected in a reflecting cup.

However, when one portion of the blue light emitted from the blue LED element excites the YAG fluorescent material and the yellow light is emitted, because the whole of the resin containing the fluorescent material is lighted, the emission part or surface occupies an area larger than the size of the LED element. Therefore, if a lens is further combined with the LED element, because the light-emitting part is larger than the aperture of the lens, a sufficient collection property of the lens is not obtained. Moreover, because the resin containing the fluorescent material looks to be tinged yellow, if the LED is used for illumination, the quality of outward appearance of the lighting equipment is reduced by the tinge of yellow of the fluorescent material. Therefore, various makers have attempted to eliminate the tinge of yellow by placing a white diffuser in front of the LED.

However, there is a problem that disposing a white diffusion plate causes attenuation of emission output of the LED, or diffusion or attenuation of light collected by the lens.

In addition, if an LED element emitting near-ultraviolet light and an RGB fluorescent material are combined, the reduction in quality of outward appearance due to the tinge of yellow is less, but there is a problem that the collection property of the lens is insufficient if the area of the resin including the fluorescent material is large.

SUMMARY OF THE INVENTION

The object of the present invention is to provide an LED having high emission efficiency and an effective focusing property which prevents having attenuation of emission and a large emission surface.

To accomplish the object, according to one embodiment of the present invention, the LED comprises a circuit board, a connecting electrode unit provided on the circuit board, a reflective cup provided in the circuit board, an LED element disposed in the reflective cup and connected to the connecting electrode unit, and a resin with which the reflective cup is filled, a fluorescent material contained in the resin converting one portion of light emitted from the LED element.

DETAILED DESCRIPTION OF THE PREFERRED EMBODIMENTS

Some preferred embodiments of the present invention will be explained in detail with reference to the accompanying drawings hereinafter.

Figure 1:
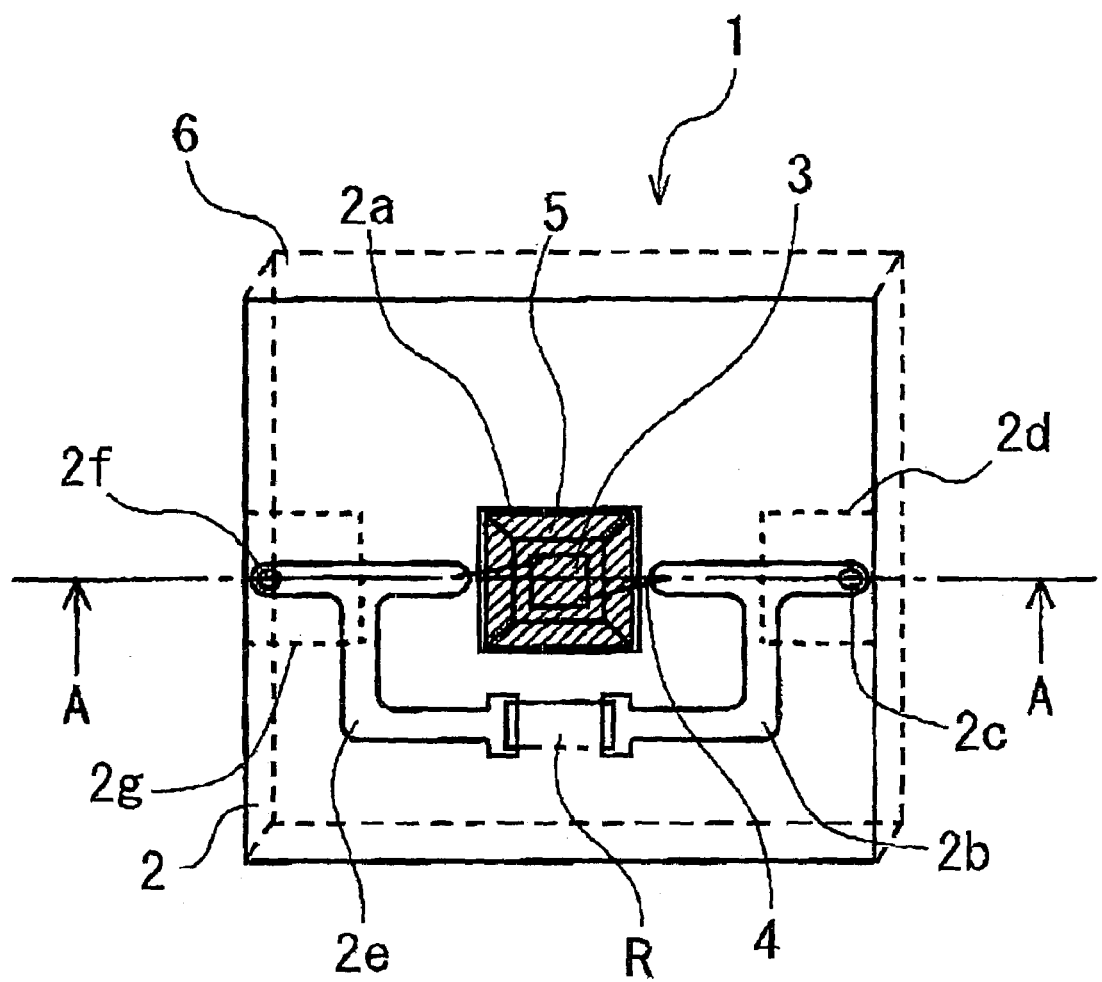
FIG. 1 is a top plan view showing an LED according to a first embodiment of the present invention.
Figure 2:
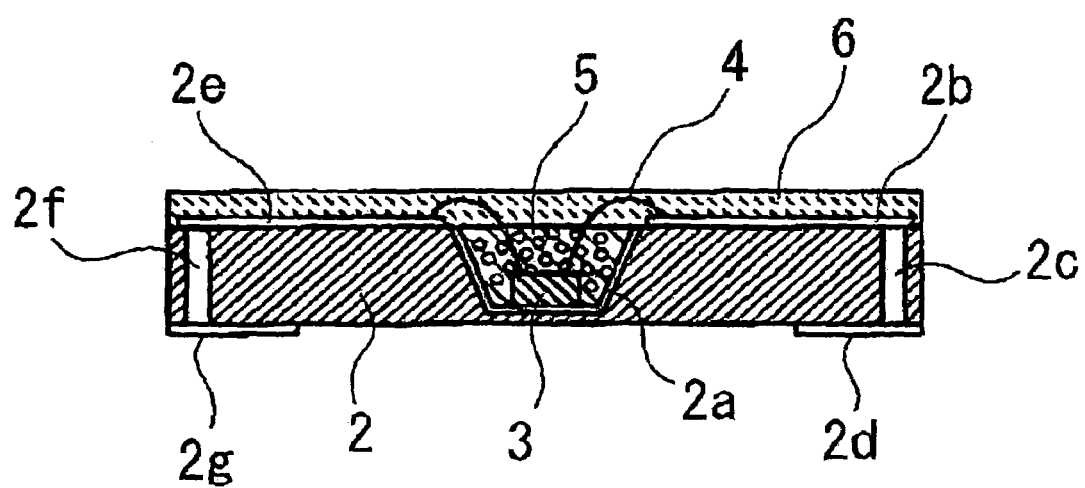
FIG. 2 is a sectional view of the LED taken along the A-A line shown in FIG. 1.

FIGS. 1 and 2 illustrate an LED 1 according to a first embodiment of the present invention. The LED 1 is, for example, of a surface-mounted type. The LED 1 includes a circuit board 2 which has one or more reflective cups 2a provided in the circuit board 2. In the first embodiment, one reflective cup 2a is formed at the central portion of the circuit board 2 (see FIG. 1). The reflective cup 2a may be formed by providing a concave potion in the circuit board or inserting a separate tubular member into the hole formed in the circuit board 2, for example.

In the illustrated embodiment, the reflective cup 2a has, for example, an inverted-truncated-cone-shaped or inverted-truncated-pyramid-shaped concave portion (see FIG. 2).

In the embodiment as shown in FIG. 1, the reflective cup 2a has a pyramidal inclined reflecting surface whose inner diameter gradually increases from the lower portion to the upper portion of the reflective cup 2a.

In addition, the reflecting surface has a straight or curved shape in section. An LED element 3 is disposed in the reflective cup 2a.

A coating of a metal such as Al, Ag, Ni or the like forms the reflecting surface so as to effectively reflect light emitted from the LED element 3, enabling the reflected light to direct upwards as seen in FIG. 2.

A connecting electrode unit for connecting the LED element 3 to an exterior electric source device (not shown) is provided on the circuit board 2. In the illustrated embodiment, the connecting electrode unit includes at least one pair of wiring patterns 2b and 2e provided on the upper surface of the circuit board 2, and at least one pair of connecting terminals 2d and 2g provided on the lower surface of the circuit board 2. The wiring patterns 2b and 2e are provided so as to extend from the adjacence or vicinity of the reflective cup 2a located at the central portion of the circuit board 2 to the adjacence or vicinity of a side surface of the circuit board 2 (see FIG. 1).

Moreover, each of the wiring patterns 2b and 2e has a wiring part branched at an intermediate portion of each wiring pattern. The wiring parts form land patterns. One or more electronic parts such as a resistor, a capacitor or the like are disposed between the land patterns, as required (see. FIG. 1).

The wiring patterns 2b and 2e are electrically connected to the connecting terminals 2d and 2g via through-holes 2c and 2f provided in the circuit board 2 at opposite sides.

The LED element 3 is structured to emit blue light or ultraviolet light, for example. The lower surface of the LED element 3 is bonded to the bottom of the reflective cup 2a through a die bonding.

The reflective cup 2a should preferably be kept as small as possible while still allowing the LED element 3 to be die-bonded.

Electrodes (not shown) are provided on the upper surface of the LED element 3. The electrodes are electrically connected to the wiring patterns 2b and 2e through bonding wires 4, for example.

A resin 5 is provided in the reflective cup 2a so as to seal the LED element 3 (see FIG. 2). A YAG fluorescent material or an RGB fluorescent material is contained in the resin 5. The fluorescent material contained in the resin converts one portion of light emitted from the LED element 3.

A translucent resin or transparent resin 6 is disposed throughout the whole upper surface of the circuit board 2 so as to cover the wiring patterns 2b, 2e, the bonding wires 4, and the resin 5 including the fluorescent material. It should be noted that the translucent resin 6 does not include a fluorescent material. Therefore, the wavelength of the light emitted from the LED element 3 is not changed when passing through the translucent resin 6. In addition, the translucent resin 6 may be configured to cover only the bonding wires 4.

Next, the operation of the LED in the above-mentioned first embodiment is described.

When a current is applied to the connecting terminals 2d and 2g and the current is passed through the LED element 3 via the through-holes 2c and 2f, the wiring patterns 2b and 2e, and the bonding wires 4, the LED element 3 emits blue light or ultraviolet light. One portion of the emitted light is excited by the fluorescent material contained in the resin 5, and the wavelength of the light in contact with the fluorescent material is changed so as to emit yellow light.

As a result, white light is emitted from the reflective cup 2a by mixture of the light emitted from the LED element and the light in which the wavelength is changed.

According to the LED in this embodiment, because it has a structure so that the LED element 3 is disposed in the reflective cup 2a provided in the circuit board 2 and connected to the wiring patterns 2b and 2e on the circuit board 2, and the reflective cup 2a is filled with the resin 5 including the fluorescent material, the light-emitting part of the reflective cup 2a can be reduced to be a point-like surface of light in the circuit board 2.

Also, the fluorescent material with a tinge of yellow contained in the resin 5 is limited in the minimum size of the reflective cup 2a according to the number of LED mounted in each of the reflective cup 2a. If an LED element is mounted in each of the reflective cup 2a, the tinged area can be reduced to be so small that the tinged area does not stand out. Because emission from the LED element 3 and reflection from the reflective cup 2a are achieved within the reflective cup 2a or in the vicinity of the reflective cup 2a, concentration of light can be effectively achieved.

Figure 3:
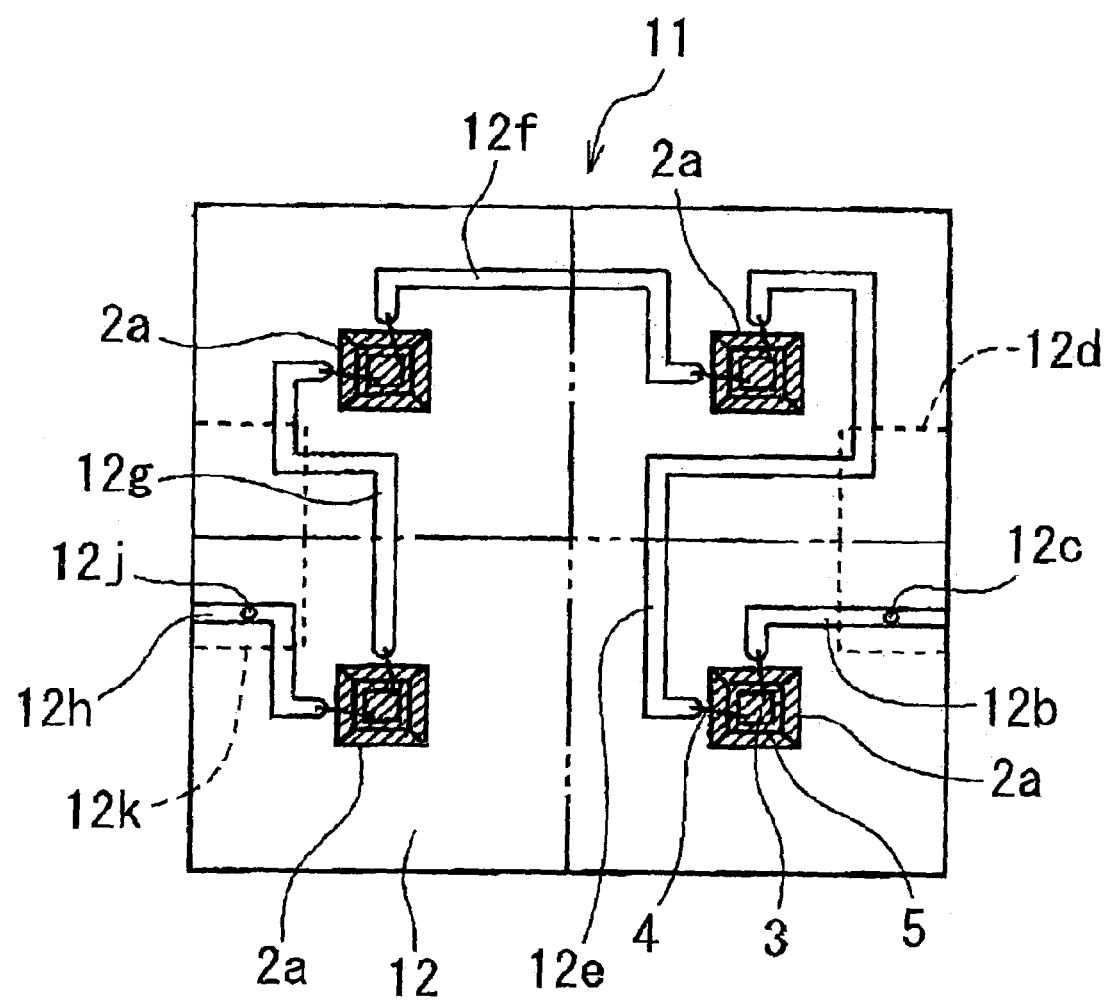
FIG. 3 is a top plan view showing an assemblage LED according to a second embodiment of the present invention.
Figure 4:
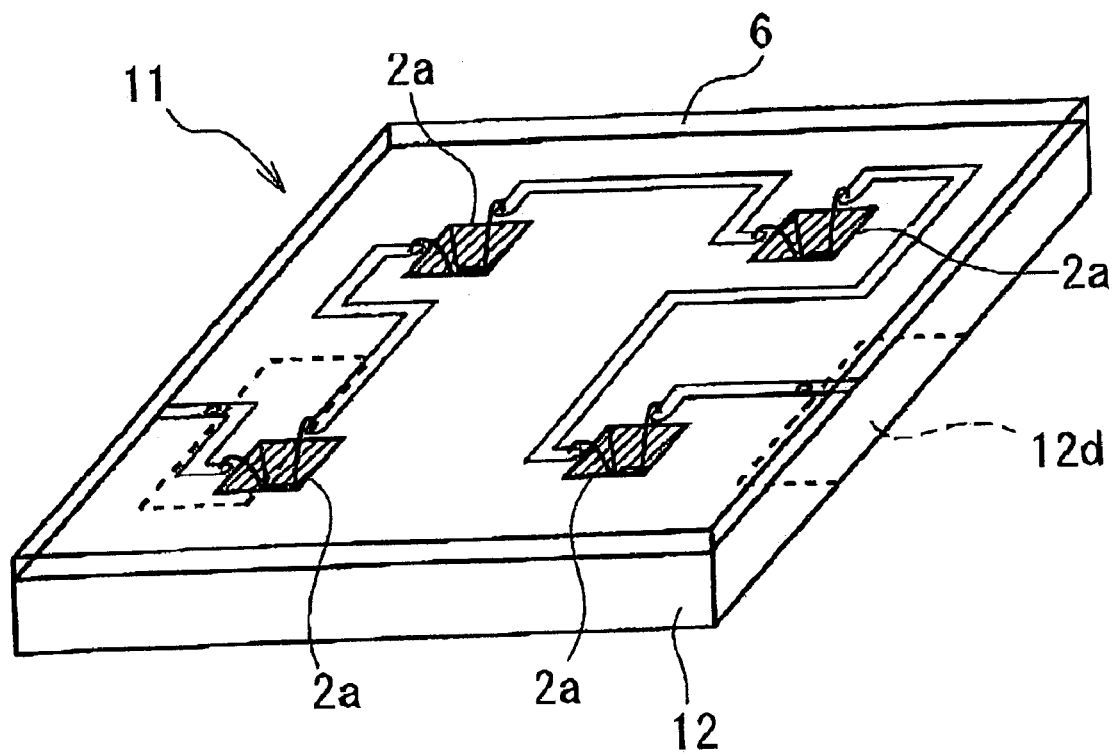
FIG. 4 is a perspective view of the assemblage LED shown in FIG. 3.

Next, the structure of an assemblage LED according to a second embodiment is described referring to FIGS. 3 and 4.

In FIG. 3, the assemblage LED is shown at reference numeral 11. The assemblage LED 11 has a structure so that a plurality of LEDs are arranged on a circuit board 12, each of the plurality of LEDs being similar to the LED 1 shown in the first embodiment. In this second embodiment, four LEDs are provided in a circuit board as shown in FIG. 3. In this embodiment, wiring patterns 12b, 12e, 12f, 12g and 12h are different in shape from the wiring patterns 2b and 2e as shown in the first embodiment, as described hereinafter.

More specifically, for example, four reflective cups 2a are provided in the circuit board 12, the wiring patterns 12b, 12e, 12f, 12g and 12h extend from the adjacence or vicinity of one side surface of the circuit board 12 via the four reflective cups 2a to the adjacence or vicinity of the opposite side surface of the circuit board 12 in series. Connecting terminals 12d and 12k shown in broken lines in FIGS. 3 and 4 are provided on the lower surface of the circuit board 12 at opposite sides thereof to make contact with the opposed side surfaces of the circuit board 12, respectively. The wiring patterns 12b and 12h are electrically connected to the connecting terminals 12d and 12k via the through-holes 12c and 12j, respectively. Because the rest of the structure of the assemblage LED is the same as in the LED 1 in the first embodiment, the same reference numbers are attached to similar parts, and a detailed description is omitted.

A large volume of light can be acquired through the assemblage LED 11, therefore, increased illumination intensity can be obtained.

Figure 5:
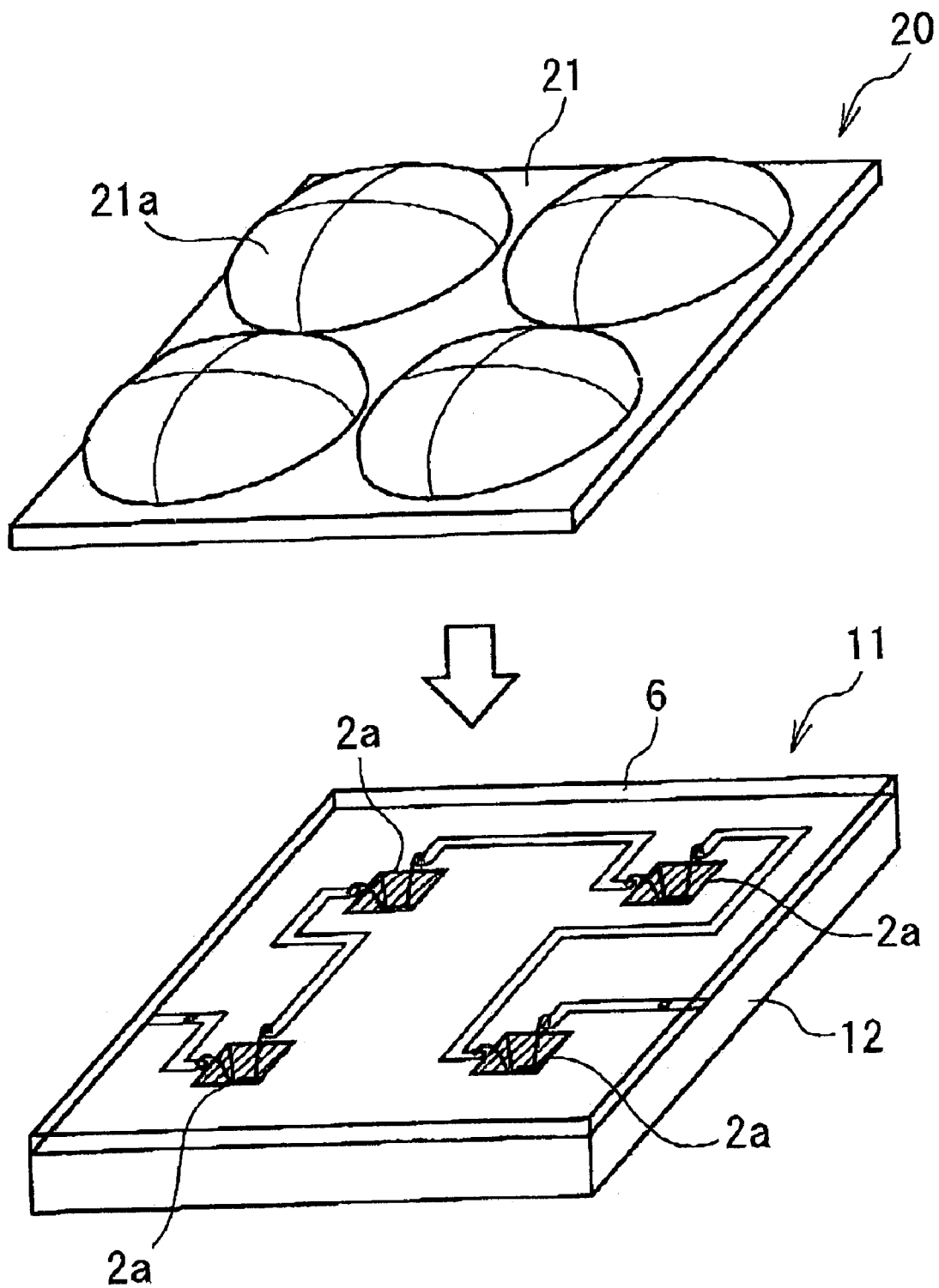
FIG. 5 is an exploded perspective view showing an assemblage LED according to a third embodiment of the present invention.

Subsequently, the structure of an LED unit according to a third embodiment of the present invention is described referring to FIG. 5.

The LED unit in the third embodiment comprises the assemblage LED 11 shown in the second embodiment and an assemblage lens 20 provided on the assemblage LED 11. The assemblage lens 20 includes a plate 21 disposed on the translucent resin 6 of the assemblage LED 11 and a plurality of lenses 21a attached to or integrated with the plate 21. The lenses 21a comprise convex lenses projecting upwardly, for example, the convex lenses being disposed to face the reflective cups 2a, respectively. In the LED unit having the assemblage lens 20, light emitted from the various LED elements of the assemblage LIED 11 is collected by the lenses 21a, hence the brightness of the LED unit is further increased.

Figure 6:
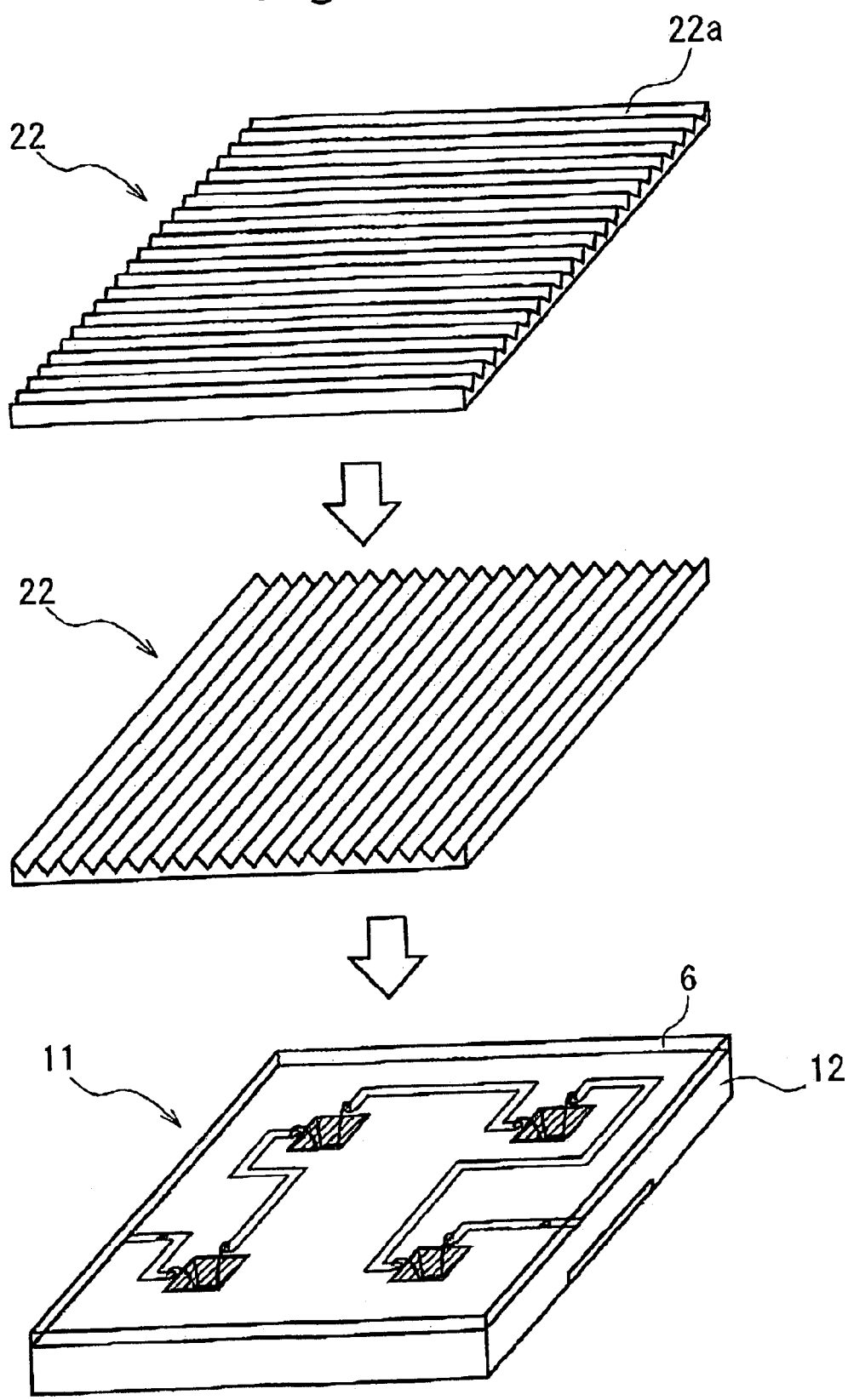
FIG. 6 is an exploded perspective view showing an assemblage LED according to a fourth embodiment of the present invention.

Next, the structure of an LED unit according to a fourth embodiment of the present invention is described referring to FIG. 6.

The LED unit in this embodiment comprises the assemblage LED 11 shown in the second embodiment and one or a plurality of optical sheets 22 disposed on the assemblage LED 11. The plurality of optical sheets 22 have a lens function and are stacked and disposed on the translucent resin 6 which does not contain any fluorescent material. Each of the optical sheets 22 comprises, for example, a prismatic sheet which is a film for converting the path of light. The prismatic sheet includes micro-prisms 22a which are arranged continuously in one direction. In such an LED unit, light emitted from the various LED elements of the assemblage LED is collected, the brightness of the LED unit is increased, and the direction of each path of light of the emitted light is altered. Two prismatic sheets 22 may be arranged in perpendicular directions with respect to each other and placed in a stack.

Meanwhile, the present invention is not limited to the above-mentioned embodiments; for example, a lead frame, an MID (Molded Interconnect Device) or the like may be used for the wiring patterns of the circuit board 2 or 12. The reflective cup 2a may be polyangular pyramidal in shape and is not limited to a cone shape or pyramidal shape. The reflective cup 2a and one of the wiring patterns 2b and 2e are electrically connected, and an LED element in which one electrode is provided on the bonding wire 4 can be connected to the reflective cup 2a directly.

In addition, the lenses 21a may be Fresnel lenses and are not limited to convex lenses, and the prismatic sheet may also be used for the single LED 1 and is not limited to the assemblage: LED 11. In this case, an optical sheet such as a diffusion sheet or the like may be used instead of the prismatic sheet. Moreover, the wiring patterns of the assemblage LED 11 may be connected in parallel rather than in series, as required.

According to the present invention, with the above-mentioned structure, the size of the emission part, in other words, the part of the resin including the fluorescent material, can be reduced to be a point-like surface of light. Therefore, because the area of the resin with a tinge of yellow is less, hence the proportion of the whole of the LED taking on the yellow tinge is minimized, and the yellow tinge does not stand out.

Moreover, because the LED element emits light at the adjacence or vicinity of the reflective cup, even if the reflective cup is small, the light is effectively reflected and the emission direction can be controlled.

In addition, because the assemblage LED is formed by combining a plurality of LEDs, the brightness can be increased through the large volume of light.

The LED according to the present invention can be applied widely for various kinds of illumination.

What is claimed is:

1. A light-emitting diode, comprising:
    a circuit board;
    a connecting electrode unit including at least one pair of wiring patterns provided on an upper surface of the circuit board;
    at least one reflective cup comprising a concave portion in the circuit board;
    at least one light-emitting diode element disposed in the reflective cup and electrically connected to the wiring patterns on the upper surface of the circuit board;
    the reflective cup filled with a resin containing
    a fluorescent material, the fluorescent material converting one portion of light emitted from the light-emitting diode element; and
    a transparent or tranlucent resin disposed on the circuit board to cover an upper surface of the resin which contains the fluorescent material and is filled in the reflective cup, and to cover the wiring patterns on the circuit board.

2. The light-emitting diode according to claim 1, wherein the connecting electrode unit further includes at least one pair of connecting terminals provided on a lower surface of the circuit board and electrically connected to the wiring patterns on the upper surface of the circuit board.

3. The light-emitting diode according to claim 1, wherein the connecting electrode unit includes at least one electronic part connected to the wiring patterns.

4. The light-emitting diode according to claim 3, wherein the electronic part is a resistor or a capacitor.

5. The light-emitting diode according to claim 1, wherein the reflective cup has a truncated-pyramid-shaped or truncated-cone-shaped concave portion.

6. The light-emitting diode according to claim 5, wherein the concave portion includes a reflecting surface having a straight or curved shape in section.

7. The light-emitting diode according to claim 6, wherein a metal coating containing Al, Ag, or Ni forms the reflecting surface.

8. An assemblage light-emitting diode, comprising:
    a circuit board;
    at least one pair of wiring patterns provided on an upper surface of the circuit board;
    a plurality of reflective cups, each comprising a concave portion in the circuit board;
    at least one light emitting diode element disposed in each of the reflective cups and electrically connected to the wiring patterns respectively on the upper surface of the circuit board; and
    each of the reflective cups filled with a resin containing
    a fluorescent material, the fluorescent material converting one portion of light emitted from the light-emitting diode element; and
    a transparent or translucent resin disposed on the circuit board to cover an upper surface of the resin which contains the fluorescent material and is filled in each of the reflective cups, and to cover the wiring patterns on the circuit board.

9. The light-emitting diode according to claim 1, further comprising at least one lens disposed to face the light-emitting diode element.

10. The light-emitting diode according to claim 9, wherein the lens includes a convex lens or a Fresnel lens.

11. The light-emitting diode according to claim 8, further comprising at least one optical sheet disposed on the transparent or translucent resin.

12. The light-emitting diode according to claim 11, wherein the optical sheet includes at least one prismatic sheet or diffusion sheet.

* * * * *